United States Patent [19]
Yao et al.

[11] Patent Number: 5,923,089
[45] Date of Patent: Jul. 13, 1999

[54] EFFICIENT ROUTING METHOD AND RESULTING STRUCTURE FOR INTEGRATED CIRCUITS

[75] Inventors: Chingchi Yao, Saratoga; Ichiro Yamamoto; Shuji Nomura, both of Sunnyvale, all of Calif.

[73] Assignee: Oki America, Inc.

[21] Appl. No.: 08/816,005

[22] Filed: Mar. 10, 1997

Related U.S. Application Data

[63] Continuation of application No. 08/397,023, Mar. 1, 1995, abandoned, which is a continuation of application No. 08/167,393, Dec. 14, 1993, abandoned.

[51] Int. Cl.⁶ .................................................. H01L 23/48
[52] U.S. Cl. .......................... 257/775; 257/207; 257/664; 257/691; 257/923
[58] Field of Search .................................... 257/774, 775, 257/664, 691, 692, 695, 923, 207

[56] References Cited

U.S. PATENT DOCUMENTS

| 4,499,484 | 2/1985 | Tanizawa et al. | 257/207 |
| 4,928,164 | 5/1990 | Tanizawa | 357/45 |

FOREIGN PATENT DOCUMENTS

| 0499063 | 8/1992 | European Pat. Off. | |
| 63-152163 | 6/1988 | Japan | 257/207 |
| 01117341 | 5/1989 | Japan | H01L 21/82 |
| 03129828 | 6/1991 | Japan | H01L 21/3205 |
| 03147350 | 6/1991 | Japan | H01L 21/82 |

OTHER PUBLICATIONS

Shiffer et al., "A 473K Gate 0.7μ CMOS Gate Array," Proceedings of Fifth Annual IEEE International ASIC Conference, Sep. 21–25, 1992/Rochester, New York, pp. 443–446.

Primary Examiner—Donald L. Monin, Jr.
Assistant Examiner—Nathan K. Kelley
Attorney, Agent, or Firm—Townsend and Townsend and Crew LLP

[57] ABSTRACT

A method and resulting structure for fabricating interconnects through an integrated circuit. The method includes adding more power lines 80, 100, 151 and/or increasing the width of power lines 120 and/or adding a power bus 140 near regions of high current flow. The resulting structure also provides more metallization near regions of high current flow. Similar to the method, the resulting structure may include additional power lines 80, 100, 151 and/or wider power lines 120 and/or a power bus 140 to increase the amount of metallization. An improved routing technique is also provided. Such routing technique includes providing an initial Ucs value and then adding additional lines near high current regions to decrease the Ucs value.

17 Claims, 12 Drawing Sheets

EFFICIENT ROUTING METHOD AND RESULTING STRUCTURE FOR INTEGRATED CIRCUITS

This is a Continuation of application Ser. No. 08/397,023 filed Mar. 1, 1995, now abandoned, which is a continuation of application Ser. No. 08/167,393 filed Dec. 14, 1993, now abandoned.

BACKGROUND OF THE INVENTION

The present invention relates to a method for efficiently routing interconnects in a semiconductor integrated circuit device. In particular, the present invention provides an improved technique and structure for interconnect routing in an integrated circuit.

In a typical integrated circuit device, the surface area of the device is occupied predominantly by conductive interconnects. In fact, a typical application specific integrated circuit (ASIC) commonly relies upon a substantial quantity of conductive traces to form interconnects therein. As integrated circuits are developed to be denser and larger, it is necessary for chip designers to become increasingly aware of both the static and dynamic properties of the conductive interconnects employed in the particular circuit. Both static and dynamic properties depend upon properties of the conductor, including material type, resistance, capacitance, layout, and cell design, among others. Depending upon the particular design, such properties affect switching speed, electromigration, power dissipation, design and process compatibility, and the like, ultimately impacting reliability.

Common interconnect materials for integrated circuits include aluminum, heavily doped polycrystalline silicon, and heavily doped single-crystal silicon. Other materials for interconnects can also comprise gold, tungsten, silicides, refractory metals, or the like. The specific interconnect employed in an application depends upon a variety of factors, including reliability, stability, conductivity, compatibility with high temperature processing, among others.

Resistance of a uniform trace or interconnect depends upon material composition, width, thickness, and length. Generally, the relationship is shown as $$R = \rho(L/TW)$$

where R is the resistance, $\rho$ is the resistivity of the material, L is the length, T is the thickness, and W is the width. For aluminum, heavily doped polycrystalline silicon, and heavily doped single-crystal silicon, sheet resistances are about 0.04, 40, and 20 $\Omega/\square$, respectively. Since the resistivity of aluminum is substantially less than the resistivity of the other interconnect materials, aluminum is generally utilized in forming lines for particular ASIC applications.

Interconnect paths made from heavily doped single-crystal silicon and heavily doped polysilicon become more resistive with increasing temperature. To decrease resistivity, silicides are typically deposited over such interconnects having higher resistances. These interconnects are sandwiches made from refractory metal silicides overlaid on either polysilicon or single-crystal silicon with no insulator in between. The combination produces a much lower sheet resistance in a given thickness than polysilicon or single-crystal silicon by itself. However, as devices have been increasingly miniaturized, silicide layers are less effective since the contact resistance between the silicide and the underlying layer predominate. Higher current densities also increase the temperature of the interconnects and therefore the resistance. Such increase in resistance further elevates the temperature and resistance of the interconnect. Moreover, the use of a silicide also increases processing difficulties and resulting costs of the integrated circuit.

As with most metals, the resistivity of aluminum also increases at higher temperatures. Such increase in resistivity occurs predominately as a result of the increase in the number of collisions of the conduction electrons with lattice phonons. Higher current densities also generally increase the temperature of aluminum and thus increase resistance which further increases temperature and resistance. As a consequence there is an increased danger of thermally induced runaway.

In an integrated circuit, higher current densities and temperatures promote the detrimental effects of electromigration. Electromigration generally refers to the transport of mass in metals when stressed to high current densities. As direct current passes through thin metal conductors in integrated circuits, high current densities may pile up metal in some regions causing a "short." High current densities may also void metal formation in other regions causing metal conductors to "open." Either problem creates detrimental effects on the performance of the device. Accordingly, current densities for typical aluminum interconnects must be kept below about 1 mA/$\mu$m$^2$. Such current densities reduce the possibility of electromigration. However, as line widths become increasingly smaller, such current densities are often difficult to consistently achieve with present grid like interconnect structures.

FIG. 1 illustrates a top view of a typical power grid gate array structure 10 (not to scale) for an integrated circuit. The power grid structure includes a $V_{DD}$ power pad 11, power ring 13, and $V_{DD}$ power grid 15 forming an interconnect. The power grid interconnection is generally made of aluminum. Aluminum typically includes a few percent of silicon and possibly copper. Silicon is alloyed with aluminum to prevent the aluminum from penetrating into the silicon substrate. Copper reduces the effect of electromigration at high currents and temperatures. The aluminum may be fabricated onto the substrate by techniques, including sputtering, masking, etching, and the like. The $V_{DD}$ power grid 15 further includes horizontal lines 19 and vertical lines 21. In the prior art, both the horizontal 19 and vertical lines 21 have the same relative width, thickness, pitch (spacing between adjacent lines), and density (1/spacing between adjacent lines) through the entire integrated circuit, respectively. (The vertical line numbering from left to right is for purposes which will be apparent in the subsequent text.) Lines for the typical grid structure include both $V_{SS}$ and $V_{DD}$ interconnect lines. $V_{SS}$ and $V_{DD}$ lines are typically referred to as the ground line and the power line, respectively, or generally the power lines. Metallization comprising $V_{SS}$ lines 24 (horizontal 27 and vertical 28), $V_{SS}$ ground pad 25, and $V_{SS}$ ground ring 26 are shown by the dashed lines. The $V_{DD}$ and $V_{SS}$ pads are typically referred to as the power and ground pads, respectively, or generally the power pads. The power lines distribute current to a plurality of cells 23 on the substrate in regions bounded by vertical lines 21 and horizontal lines 19. Each cell represents active devices including at least a MOSFET, CMOSFET, BiCMOS device, bipolar transistor, or the like.

FIG. 2 is a top view of an interconnect for gate array structure 30 with wider but fewer vertical power lines 33 than the power grid gate array structure of FIG. 1. Like the previous structure, gate array structure 30 includes a $V_{SS}$ ground pad, $V_{SS}$ horizontal lines, $V_{SS}$ vertical lines, $V_{SS}$ ground ring, $V_{DD}$ power ring, $V_{DD}$ power pad, and $V_{DD}$ horizontal power lines. As shown, the $V_{SS}$ structures are represented by the dashed lines (not to scale). However, such gate array structure relies on wider but fewer vertical power lines than the structure of FIG. 1 to decrease the current density therein. The width (W) of the vertical power line for gate array structure 30 is substantially greater than the width of the vertical power line for a comparable structure such as the power grid gate array structure of FIG. 1. However, gate array structure 30 generally uses more metal for $V_{SS}$ and $V_{DD}$ lines than desired. Accordingly, the wider vertical power lines occupy more die surface area than desired, thereby creating an inefficient use of die surface area.

With increasingly smaller line widths, the power grid structures of FIGS. 1 and 2 are inherently problematic. If a line is designed too small, the line fails to effectively transfer current therein. Specifically, high current density creates electromigration effects. Electromigration can lead to a "short" or an "open" in the interconnect structure. Alternatively, if a line is over designed, redundant metallization takes up precious die surface area which can otherwise occupy active areas. As integrated circuits become denser, effective use of die area becomes more important.

FIG. 3 illustrates current flow (I) near a top region of each line plotted against line number (n) for the structure of FIG. 1. More current flows through power lines which are geometrically closer to the power pad because of lower accumulated total resistance and the cumulative effect of a greater number of potential current sinks. As the distance between the power line and the power pad increases, the amount of current flowing through the power line decreases. The current flowing through the fifth power line 5 being connected through the shortest path to $V_{DD}$ is greater than the current flowing through power lines 4 to 1 or 6 to 9. The larger current flowing through power line 5 leads to higher temperatures and therefore provokes problems including electromigration, slower switching speeds, higher power consumption, and others. Less current flowing through lines 1 and 9 may indicate that such lines were over designed and therefore occupy more die area than necessary. A similar current distribution is also present in the structure of FIG. 2.

A specific example of a power grid structure 60 for a gate array which was actually simulated is illustrated by the top view of an integrated circuit of FIG. 4. The power grid structure includes a power ring 62, $V_{DD}$ power pad 65, vertical power lines 64, and horizontal power lines 67. A $V_{SS}$ ground pad 61 and $V_{SS}$ lines 69 are also shown as represented by the dashed lines (not to scale). A plurality of active cells 68 are in the regions between adjacent power lines. Power grid structure 60 comprises "n" vertical power lines numbered from the left side of the integrated circuit and "m" horizontal power lines numbered from the top of the integrated circuit. For the device of FIG. 4, n and m are equal to 48 and 256, respectively. Both horizontal and vertical power lines each have a width of about 2.1 $\mu m$ ($\mu$) and the power ring has a width of about 97.3$\mu$. The thickness of each power line is about 1.0$\mu$ and the lines also comprise aluminum. The integrated circuit also has a length (L) of about 9690$\mu$ and a width (W) of about 9702$\mu$. Each cell has a width of 10.5$\mu$ and a length of 30$\mu$, and includes two p-channel MOS transistors and two n-channel MOS transistors. To exercise the device for simulation, a current source at about 128 mA was applied to the $V_{DD}$ power pad. Current through the integrated circuit is assumed to be uniformly dissipated therein. Actual measured values of current density near a top region of each line confirm higher current densities are localized near the $V_{DD}$ power pad, as represented in Table 1.

TABLE 1

| VERTICAL LINE NUMBER | CURRENT DENSITY (mA/$\mu^2$) |
|---|---|
| 1 | 0.24 |
| 2 | 0.18 |
| 3 | 0.20 |
| 4 | 0.22 |
| 5 | 0.24 |
| 6 | 0.27 |
| 7 | 0.30 |
| 8 | 0.33 |
| 9 | 0.36 |
| 10 | 0.40 |
| 11 | 0.45 |
| 12 | 0.50 |
| 13 | 0.55 |
| 14 | 0.62 |
| 15 | 0.69 |
| 16 | 0.78 |
| 17 | 0.88 |
| 18 | 0.98 |
| 19 | 1.10 |
| 20 | 1.24 |
| 21 | 1.41 |
| 22 | 1.64 |
| 23 | 2.00 |
| 24 | 2.86 |
| 25 | 2.86 |

Specifically, the highest current density existed at vertical power lines 24 and 25. These two power lines are directly adjacent to the power pad as shown. Vertical power lines 24 and 25 each have a current density of 2.86 mA/$\mu^2$. Such current density is substantially greater than the upper value of 1 mA/$\mu^2$ for an interconnect comprising aluminum. Such upper value is the current density value at which the effects of electromigration begin.

To further illustrate the non-uniform distribution of current, current density as a function of vertical power line distribution for the integrated circuit of FIG. 4 is illustrated by FIG. 5. The horizontal axis represents line numbering (n) and the vertical axis represents current density near a top region of each line (mA/$\mu^2$). As shown, the current density increases from about 0.20 mA/$\mu^2$ at the edge of the die to about 2.86 mA/$\mu^2$ for the power lines directly adjacent to the power pad. As for power lines 1–3 which are near an edge, the current density is substantially less than the design criteria of 1 mA/$\mu^2$. Thus, the power lines near the edge use more die area than desired, thereby creating an inefficient use of die surface area. The power lines near the power pad have a current density substantially greater than the upper value of 1 mA/$\mu^2$ for an aluminum interconnect, thereby requiring more metallization to reduce current density and electromigration problems. Accordingly, the integrated circuit illustrated suffers from non-uniform current densities which aggravate electromigration effects and impair efficient use of die surface area.

As illustrated in FIG. 5, current is not uniformly distributed among power lines of a typical integrated circuit having a grid like power interconnect structure. The combination of substantially even spacing between the power lines and uniform power line width, thickness, and length cause higher current densities near particular regions. Such regions include power pads and power bus lines, among others. Higher current densities also increase the temperature at such regions. Higher temperatures coupled with high current densities may provoke the detrimental effects of electromigration as well as degrade device performance. The problems described herein exist in integrated devices such as application specific integrated circuits (ASICS), custom integrated circuits, standard products including at least microprocessors (MICROS), gate arrays, programmable devices, and the like. Such integrated devices may employ technology including metal oxide silicon field effect transistors (MOSFET), complementary metal oxide silicon field effect transistors (CMOSFET), bipolar complementary metal oxide silicon field effect transistors (BiCMOS), bipolar transistors (bipolar), among others.

SUMMARY OF THE INVENTION

The present invention provides a method and resulting structure for efficiently routing interconnects in a semiconductor integrated circuit device. In particular, the present invention provides an improved technique for interconnect routing through an integrated circuit by a unique layout configuration wherein current densities through the power lines are distributed more uniformly and are below an upper current density by supplying more metallization in regions along the current paths of highest expected current and/or by supplying metallization along bypass routes to current sinks with higher current requirements. The structure improves device performance, prevents electromigration of metal, and provides more efficient use of device surface area.

In a specific embodiment, the invention provides a method of fabricating interconnects for an integrated circuit which includes the steps of providing a partially completed integrated circuit having a top surface, and of depositing metallization overlying the top surface. The metal is preferentially etched to form a plurality of power lines in contact with a power pad such that the power lines near the power pad have more metallization than the power lines further away from the power pad.

In a modification to the preceding embodiment, the power lines near the power pad have a smaller pitch or higher line density than the power lines further away from the power pad to provide more metallization in regions near the power pad. The pitch may gradually increase from the smaller pitch to the larger pitch. Alternatively, the smaller pitch is constant for a group of power lines near the power pad, and a group of power lines further away from the power pad is constant at the larger pitch.

Alternatively, the power lines near the power pad have a larger width than the power lines further away from the power pad to provide more metallization in regions near the power pad. The width of the power lines decreases linearly or exponentially to the smaller width. Alternatively, the larger width is constant for a group of power lines near the power pad, and a group of power lines further away from the power pad have a smaller width.

A further modification includes forming a power bus structure during the preferential etching step. The power bus structure is typically formed around a cell or cells requiring higher current than adjacent cells. Such power bus structure provides a more uniform distribution of current densities below an upper current density through the integrated circuit. The upper current density is the current density value where the effects of electromigration begin for the particular application.

In an alternative specific embodiment, the invention also provides an improved interconnect structure. The interconnect structure includes at least one metallization layer having at least one power pad connected to a plurality of power lines. The power lines near the power pad have a higher density or smaller pitch or larger width than the power lines further away from the power pad.

A further specific embodiment includes a method of routing interconnects in an integrated circuit. Such method includes providing power lines having an initial Ucs value (number of cells between adjacent common lines) for an integrated circuit. In regions of high current requirements, the method provides routing additional power lines thereby decreasing the Ucs value to create a more uniform distribution of current densities below an upper current density. Such upper current density is the current density value where the effects of electromigration begin for the particular application.

A further understanding of the nature and advantages of the present invention may be realized by reference to the latter portions of this specification and attached drawings.

DESCRIPTION OF SPECIFIC EMBODIMENTS

Figure 6:
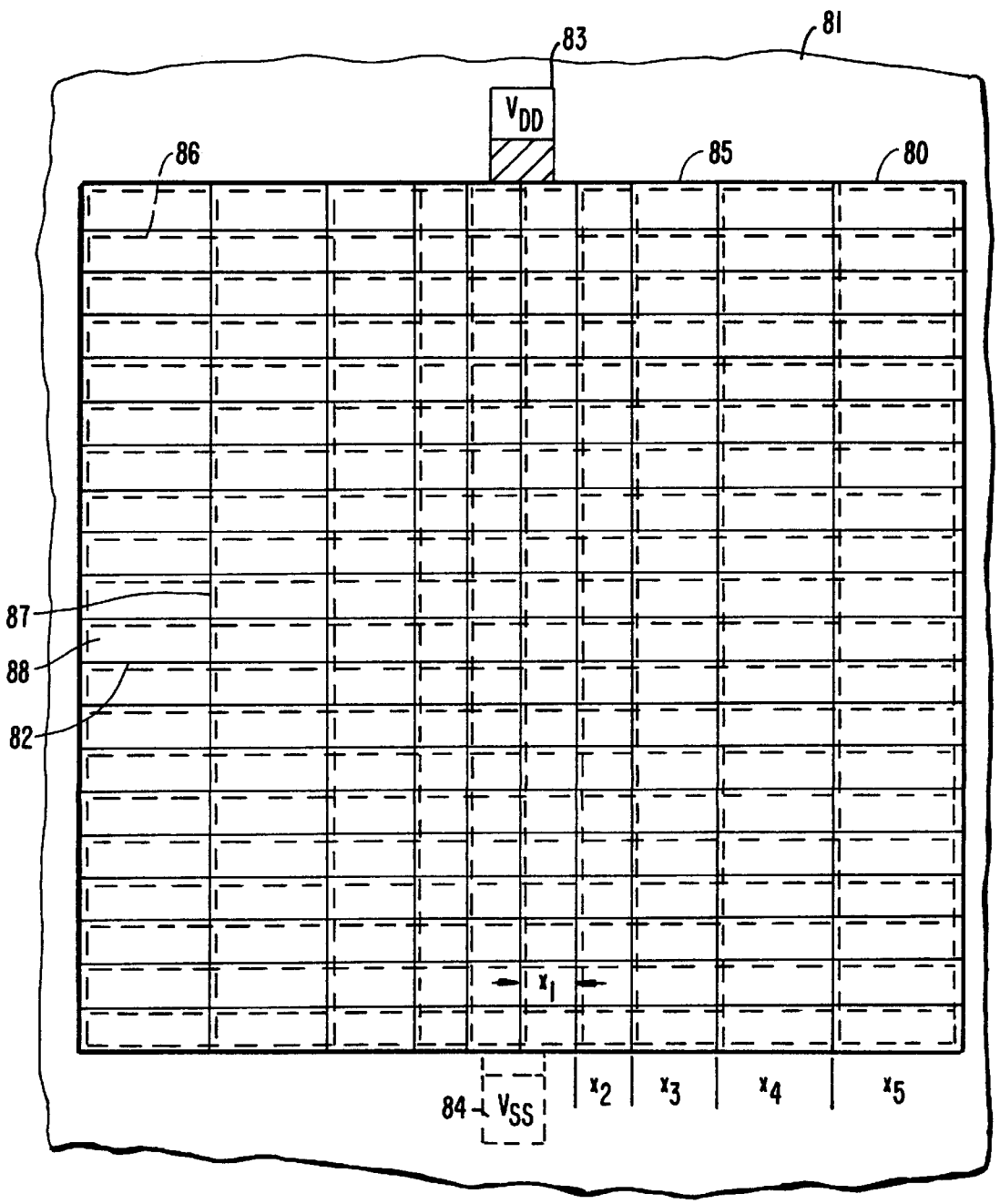
FIG. 6 is a top view of an embodiment of the improved power grid structure.

The improved power grid structure is shown, for example, in the context of a typical gate array structure. The concept of such power grid structure may also be applied to integrated devices including other types of ASICs, custom integrated circuits, standard products including at least MICROs, gate arrays, programmable devices, and the like. These integrated devices may employ technology such as MOSFET, CMOSFET, BiCMOS, bipolar, among others. In a specific embodiment, an improved power grid structure 80 is shown in FIG. 6 on substrate 81. Peripheral circuits, bonding pads, special cells, and interconnects which are typically components of any gate array structure are not shown on substrate 81 to more clearly illustrate improved grid structure 80 and in particular vertical power lines 87. The improved power grid structure includes interconnect elements such as horizontal power lines 82, $V_{DD}$ power pad 83, power ring 85, and vertical power lines 87. The respective number of horizontal and vertical power lines are shown for illustrative purposes only and should not be limiting in any manner. The gate array also includes cells 88 located between adjacent power lines 82 or 87. $V_{SS}$ lines 86 and a $V_{SS}$ ground pad 84 are also shown as represented by the dashed lines. The width and thickness of each power line are respectively equal. However, the pitch or density of the power lines may vary depending upon its location. Power lines near regions with higher current such as the regions near the power pad, have a smaller pitch (or closer line spacing) or higher density. Power lines proximate to regions with less current, typically further away from the power pad, have a larger pitch or lower density. To achieve the desired result, pitch for the vertical power lines near power pad 83 is smaller than the vertical power lines further away from power pad 83 such that $x_1<x_2<x_3<x_4<x_5$. As shown, the density of the vertical power lines increases from a region of less current flow such as the edge of the integrated circuit to $V_{DD}$ power pad 83. $V_{DD}$ power pad 83 and $V_{SS}$ ground pad 84, or generally the power pads are located near a center region at an edge of the die, respectively. Alternatively, each power pad may also be located in regions including a corner region, edge region, among others. At such regions, the corresponding power lines have a higher density or smaller pitch than the power lines in regions further away from the power pad.

Figure 7:
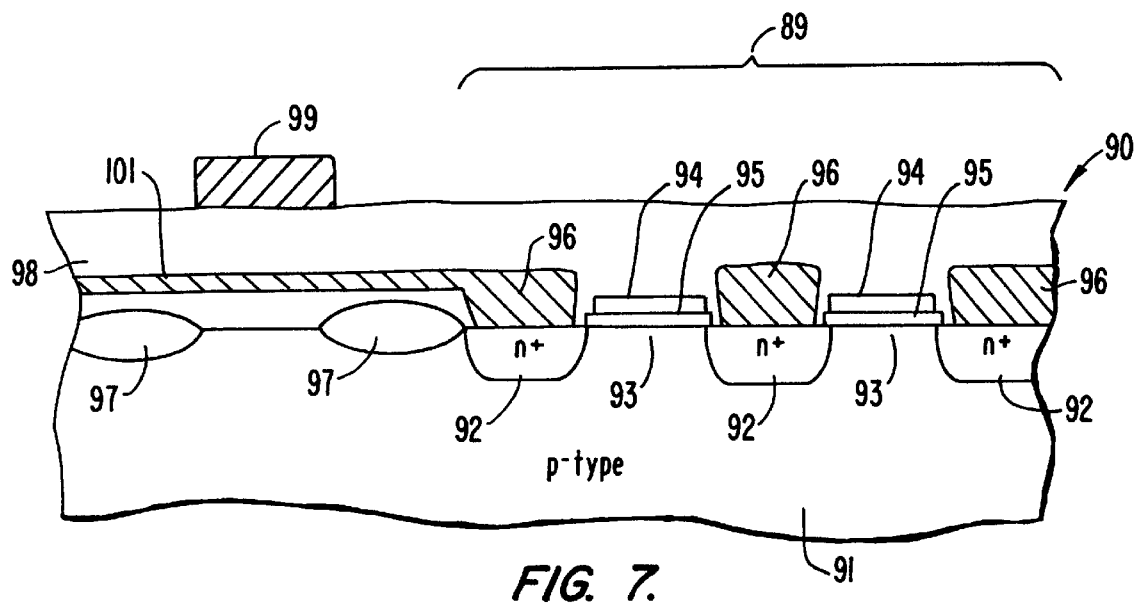
FIG. 7 is a side view of a portion of typical cell in the improved power grid structure of FIG. 6.

A cross-sectional view illustrating a portion of a typical gate or CMOS cell 90 for a portion of the improved power grid structure of FIG. 6 is shown in FIG. 7. The portion of the cell is shown in context to n-channel structures 89 for illustrative purposes only. Alternatively, a different cross-sectional view provides both a n-channel and p-channel structure representing the CMOS technology employed in the present example. Each cell may also be fabricated with p-channel technology, n-channel technology, bipolar technology, BiCMOS technology, or the like. The cross-sectional view includes n-channel devices fabricated on a p-type substrate 91. Such devices include $n^+$ type diffusions 92, n type channels 93, polysilicon gates 94 on a thin layer of oxide 95, and metallized contacts 96. Generally, such metallized contacts and portions of horizontal lines 101 are portions of a first metallization layer typically comprising aluminum. Fabrication of the aluminum layer occurs by the steps of at least sputtering, masking, and preferential etching. The cross-sectional structure also includes field oxide isolation regions 97 and an overlying insulating layer 98. The insulating layer is typically made of silicon dioxide or silicon nitride and is applied by methods of oxidation, chemical vapor deposition, or the like.

Overlying the insulating layer is a second metallization layer including the vertical power line structure 99. Like the first metallization layer, steps of at least sputtering, masking, and preferential etching forms the second metallization layer. The vertical power line structure may be in contact with each cell through a via (not shown) to metallized contacts 96 on the n type diffusion region. Alternatively, the vertical power line structure may be contacting a cell through a horizontal portion (not shown) of the first metallization layer. At least one of the metallized contacts 96 are also common with a $V_{SS}$ ground pad. The actual interconnection employed depends on the particular application.

Figure 8:
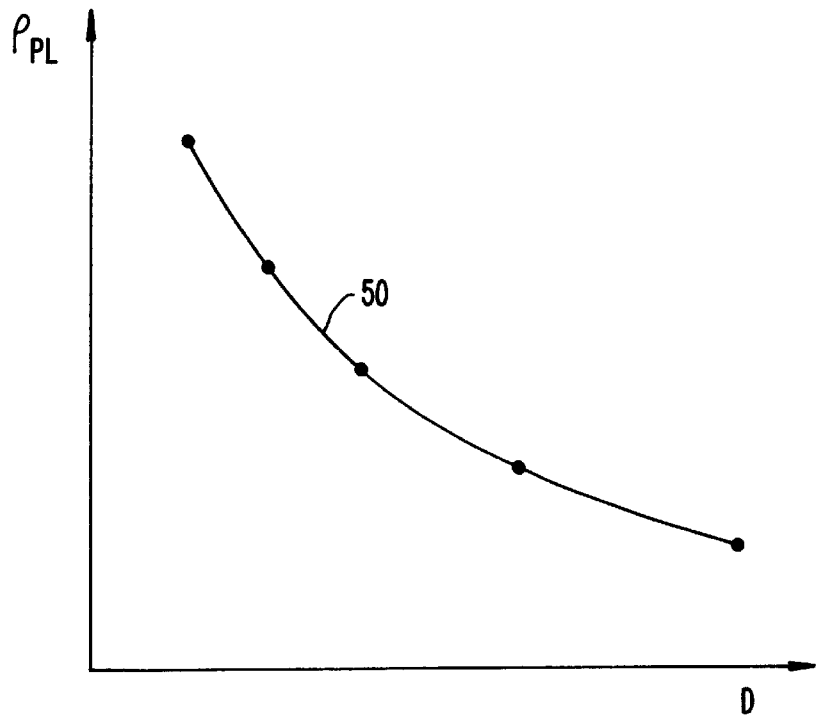
FIG. 8 is a power line density distribution of the improved power grid structure of FIG. 6.

The relationship 50 between vertical power line density ($\rho_{PL}$) and horizontal distance (D) from the $V_{DD}$ power pad for the power grid structure of FIG. 6 is illustrated by FIG. 8. Vertical power lines near the $V_{DD}$ power pad are designed at a higher density. As the horizontal distance (D) increases from either side of the $V_{DD}$ power pad, the density of vertical power lines is decreased. The relationship 50 is typically not linear but may be substantially linear. Power lines are selectively laid out or routed such that the current densities of the vertical power lines are more uniform. Such power lines are also designed with a thickness and width to prevent electromigration and provide for the efficient allocation of surface area on the die surface. Relationship 50 is in context to a single high current density region near $V_{DD}$ power pad 83. For a plurality of high current density regions and/or power pads, the relationship may be sinusoidal or the like. Such relationship will generally include a peak or maximum to represent each region of high current density, typically near a power pad.

Figure 9:
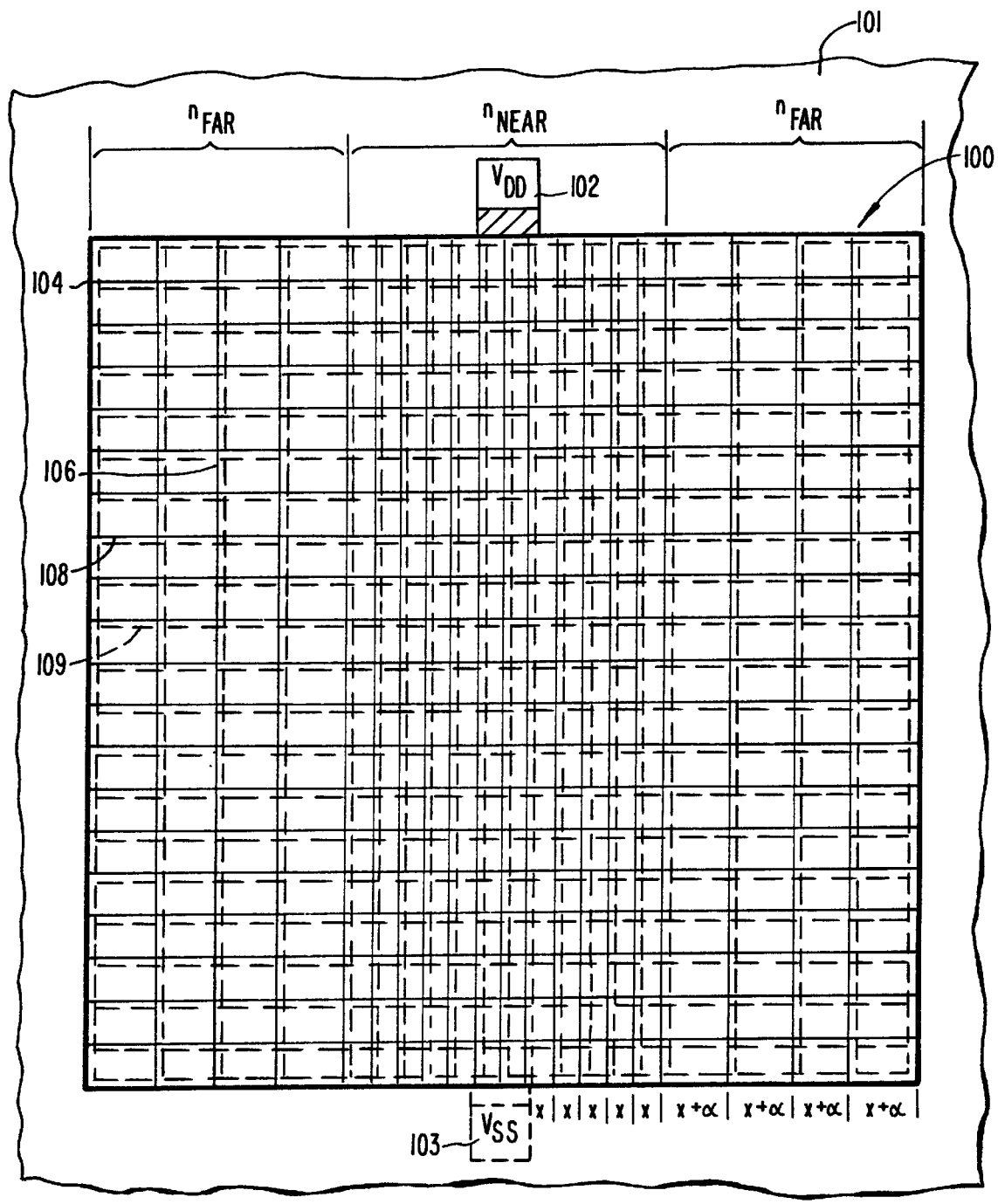
FIG. 9 is a top view of an alternative embodiment of the improved power grid structure.

An alternative embodiment of the power grid structure 100 is shown in FIG. 9 on substrate 101. Like the previous embodiment, the power grid structure includes a $V_{DD}$ power pad 102, power ring 104, vertical power lines 106, and horizontal power lines 108. A $V_{SS}$ ground pad 103 and $V_{SS}$ lines 109 are also shown as represented by the dashed lines. The respective number of horizontal and vertical power lines are shown for illustrative purposes only and should not be limiting in any manner. Peripheral circuits, bonding pads, special cells, and interconnects which are typically components of any gate array structure are not shown on substrate 101 to more clearly illustrate improved grid structure 100 and in particular vertical power lines 106. However, instead of increasing pitch or decreasing density of each power line further away from the power pad, the pitch or density of the power lines are quantized. In particular, the group of power lines near the power pad ($n_{near}$) are fixed at a certain pitch (x). Those groups of power lines further away ($n_{far}$) from the power pad are fixed at another pitch (x+α). The exact pitch and number of lines for either set of power lines depend on the particular application.

Figure 10:
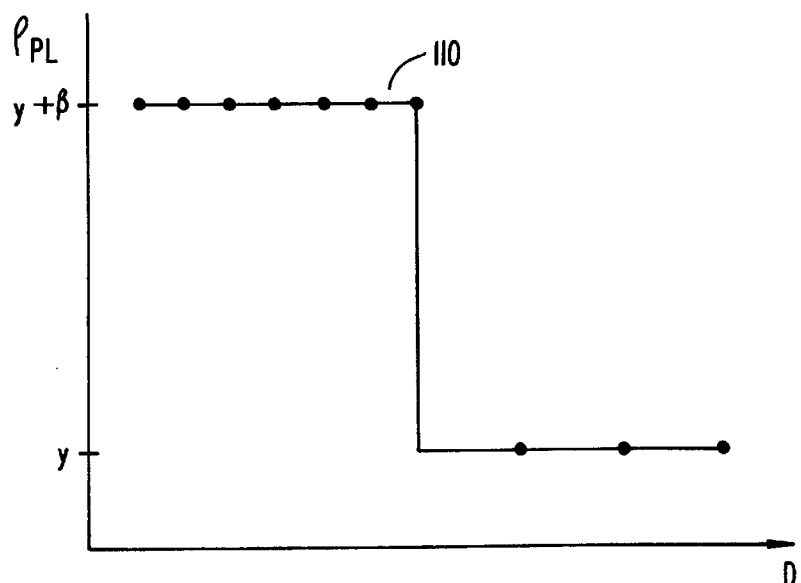
FIG. 10 is a power line density distribution of the improved power grid structure of FIG. 9.

The relationship 110 between power line density ($\rho_{PL}$) and horizontal distance (D) from the power pad for vertical lines 106 in the power grid structure of FIG. 9 is illustrated by FIG. 10. The group of power lines ($n_{near}$) near the power pad has pitch x or line density y+β, and the group of power lines ($n_{far}$) further away from the power pad has pitch x+α or line density y. The groups of power lines are laid out or routed such that the current densities of the power lines are more uniformly distributed. Such power lines are also designed with a thickness and width to prevent electromigration and provide for the efficient allocation of die surface area. Relationship 110 is a one-step function in context to a single high current density region near $V_{DD}$ power pad 102 located near a center region at an edge of the die. Such one-step function including two line density values is a most simplified illustration. For a plurality of high current density regions and/or power pads, the relationship may be 2-step, 3-step, or greater depending upon the number of high current density regions and/or power pads. The relationship will also depend upon the actual location (such as an edge near a corner, corner, or the like) of each high current density region and/or power pad on the die.

Figure 1:
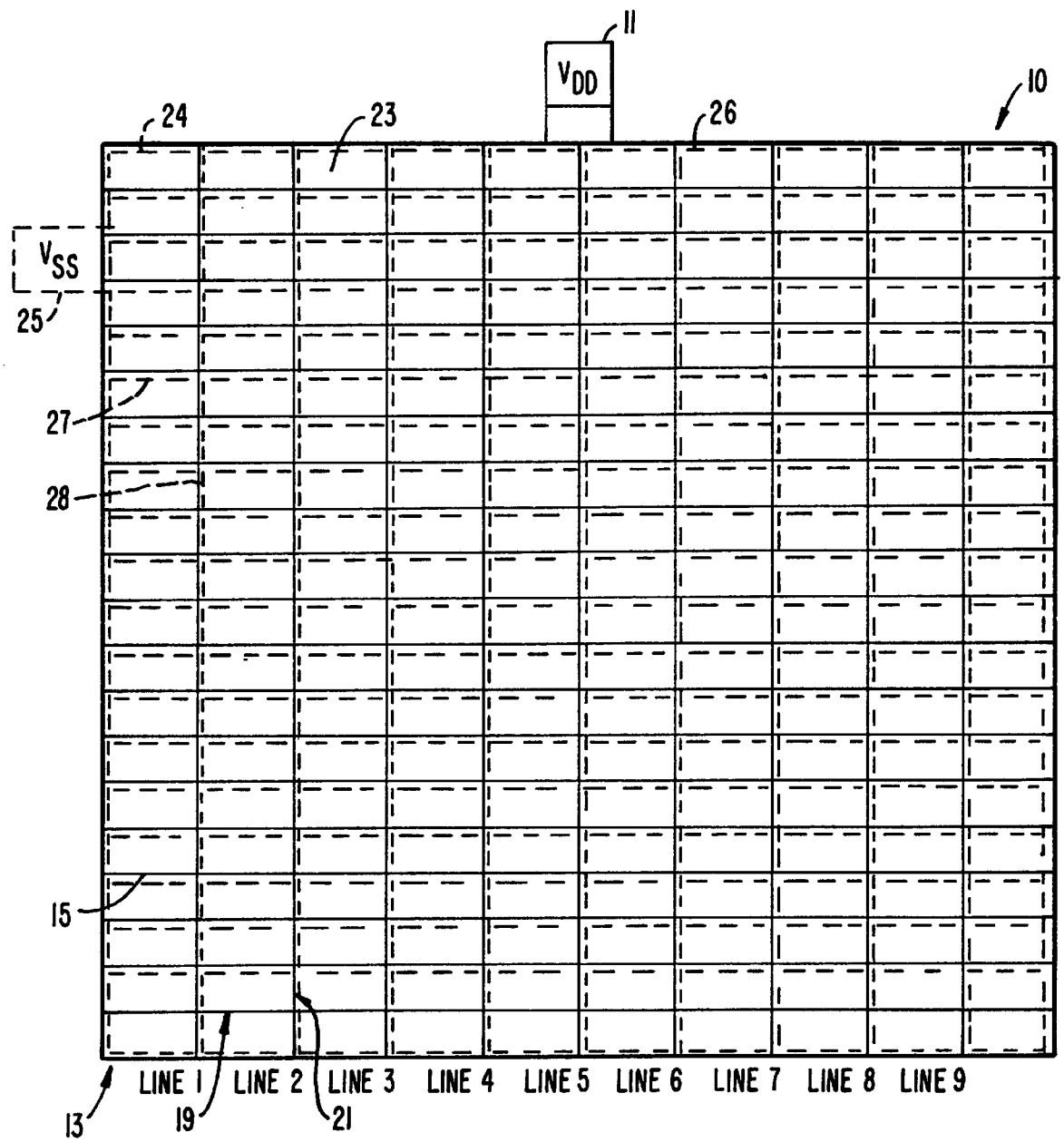
FIG. 1 is a top view of a power grid gate array structure.
Figure 2:
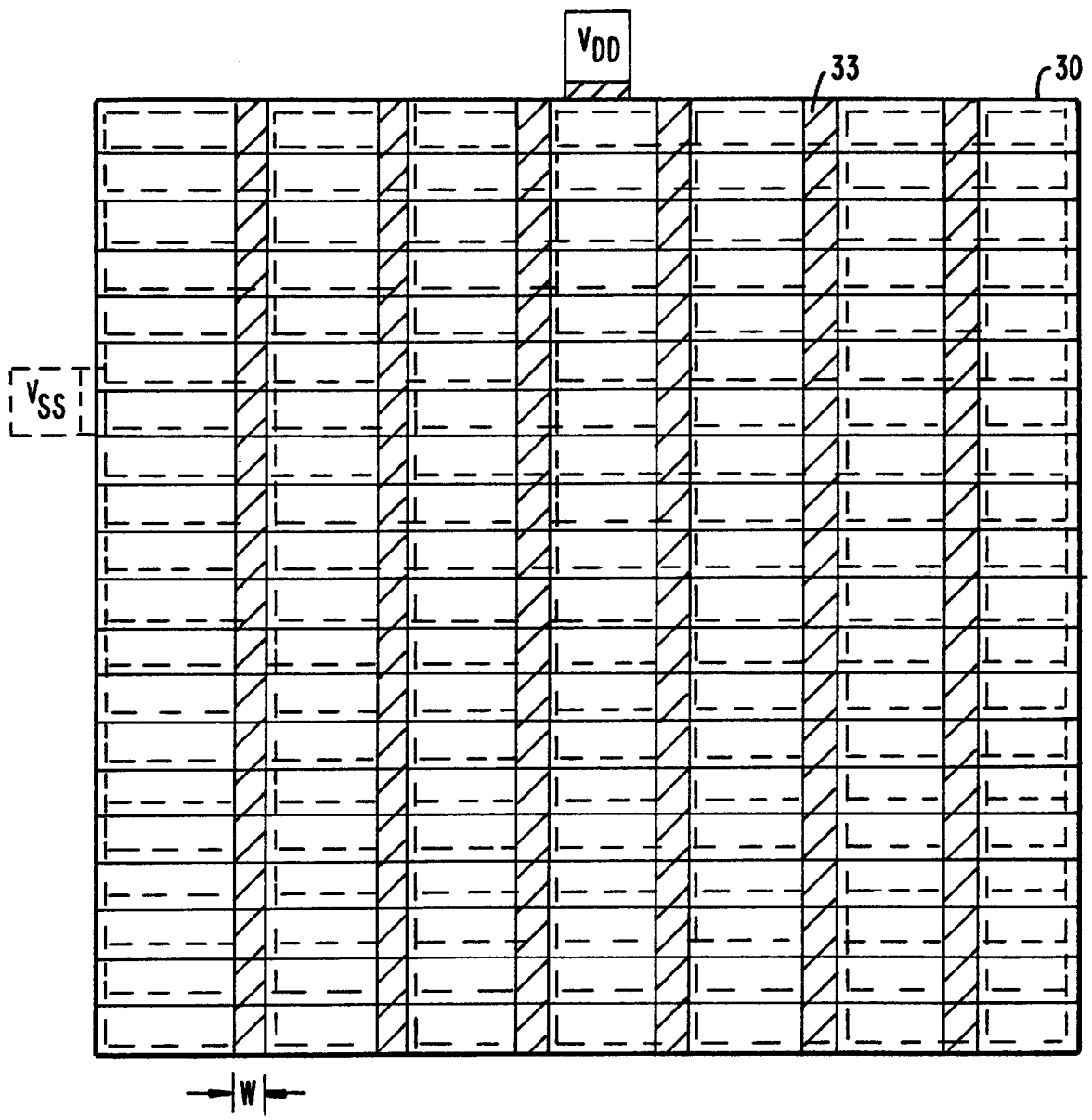
FIG. 2 is a top view of an interconnect for gate array structure with wider but fewer vertical power lines than the structure of FIG. 1.
Figure 3:
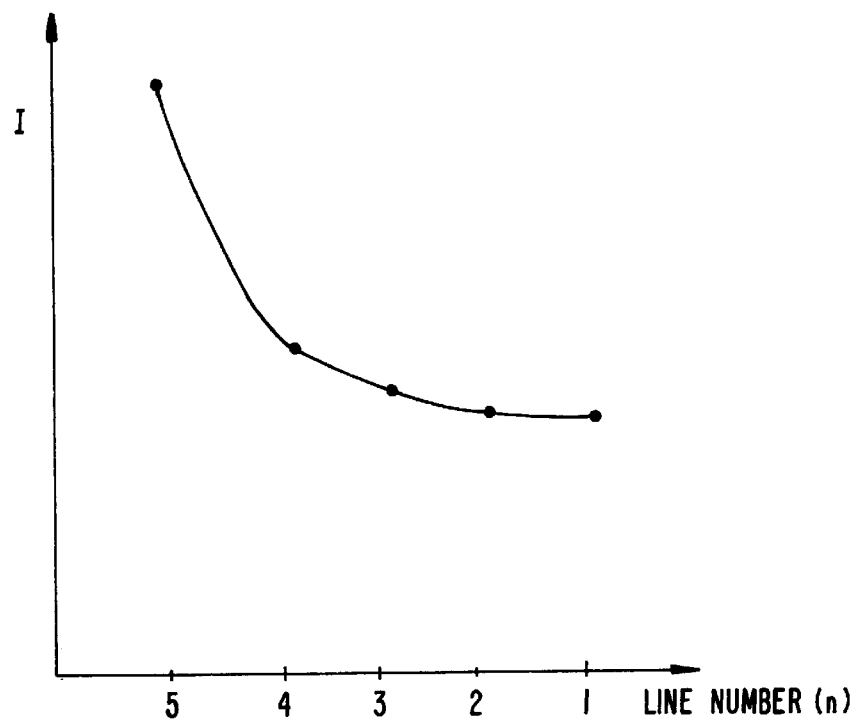
FIG. 3 is a current distribution near a top region of each line for the power grid structure of FIG. 1.
Figure 5:
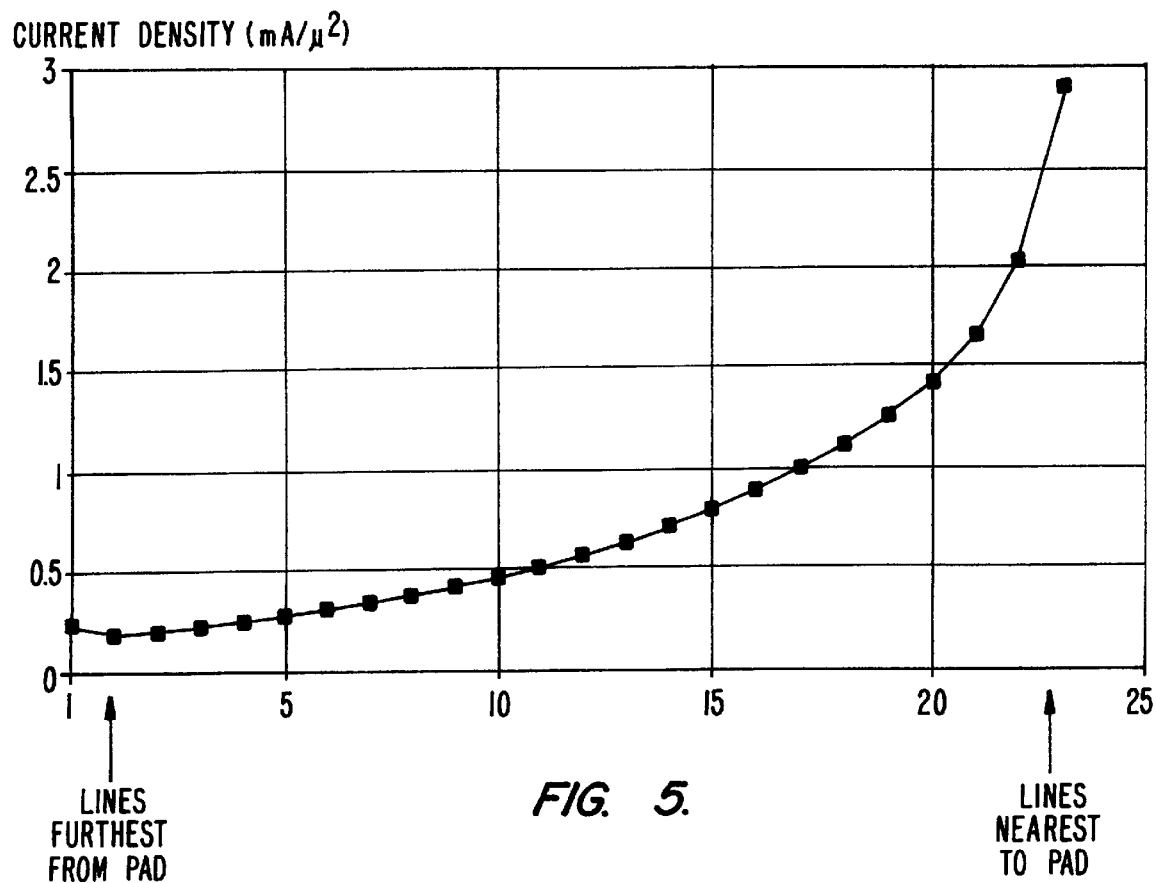
FIG. 5 is a current density distribution of the power grid structure of FIG. 4.
Figure 4:
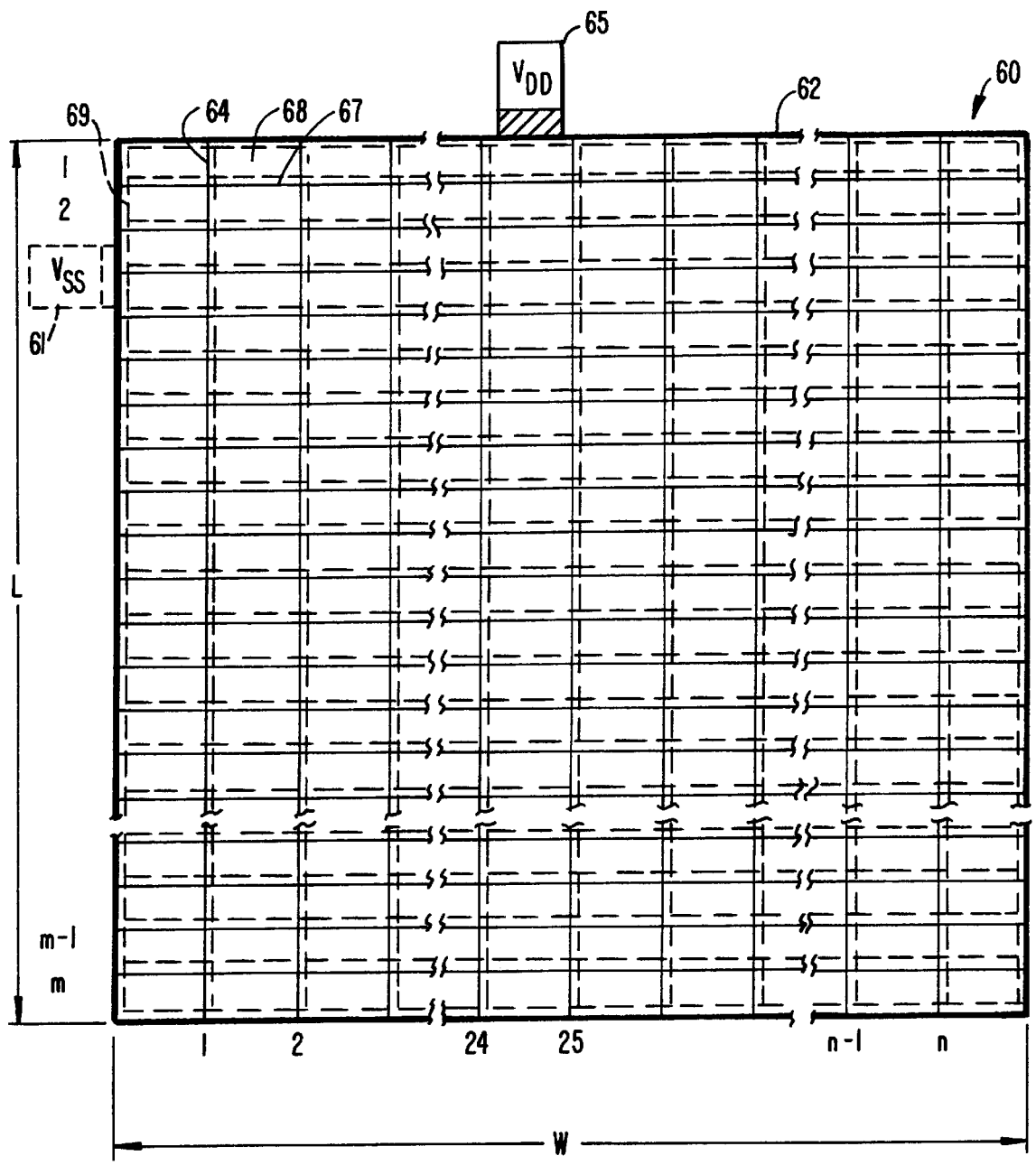
FIG. 4 is a top view of a specific example of a power grid structure which was actually simulated.
Figure 11:
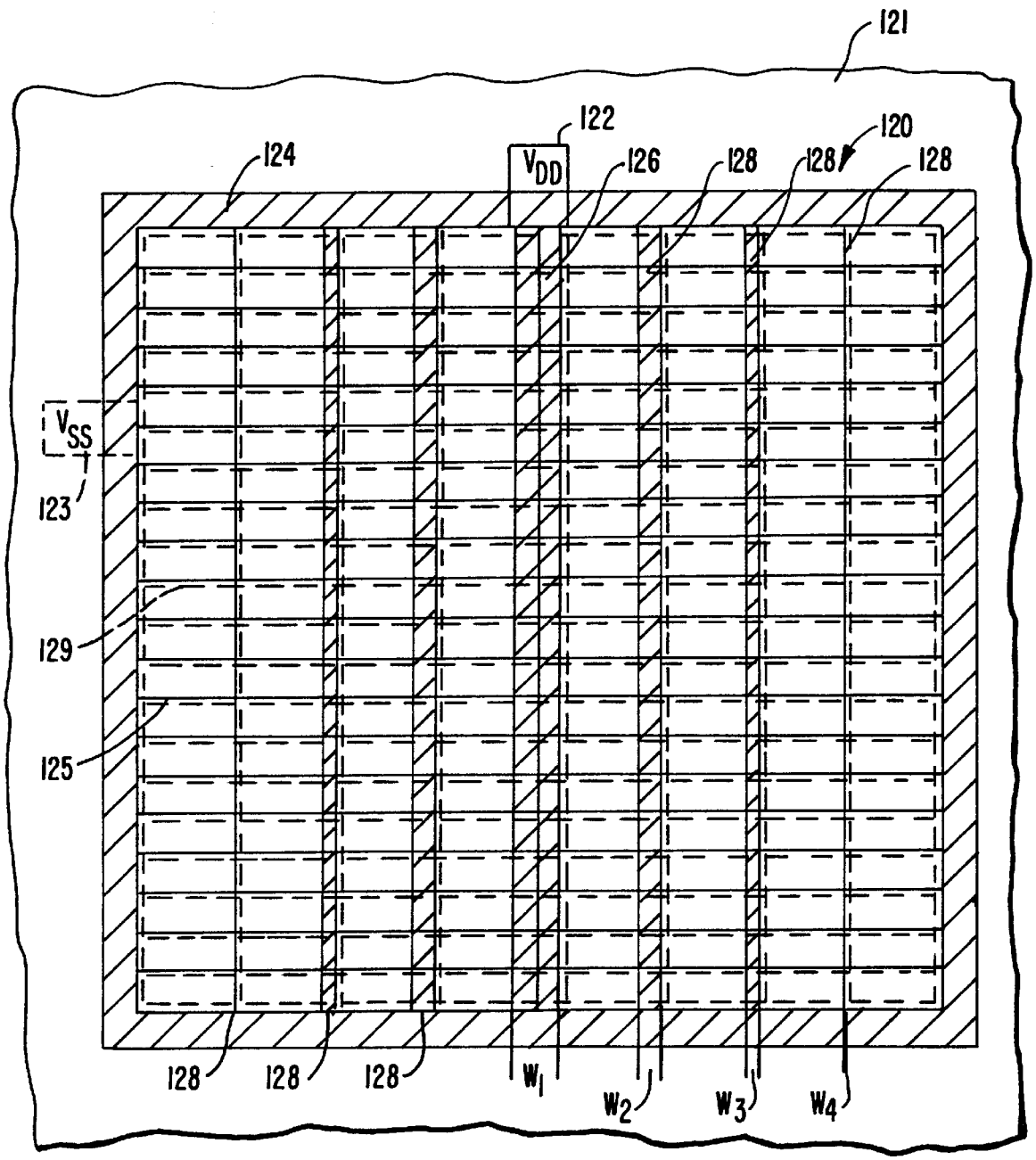
FIG. 11 is a top view of a further embodiment of the improved power line structure with varying power line widths.

A further alternative embodiment 120 is illustrated in FIG. 11 on substrate 121. Like the previous embodiments, this embodiment includes a $V_{DD}$ power pad 122, $V_{SS}$ ground pad 123, power ring 124, $V_{DD}$ power lines 125, and $V_{SS}$ lines 129 (dashed lines not to scale). Such power ring is typically of uniform width along each edge as illustrated or varying width (cascade) if required by the particular application. The respective number of horizontal and vertical power lines are shown for illustrative purposes only and should not be limiting in any manner. Peripheral circuits, bonding pads, special cells, and interconnects which are typically components of any gate array structure are also not shown on substrate 121 to more clearly illustrate improved line structure 120. Instead of varying the pitch of the power lines, the width (W) of each power line may be varied to distribute current densities more uniformly through the integrated circuit. The improved interconnect structure is typically designed with power lines having larger line widths in regions with higher current density. Such regions are generally near power pads, power buses, and the like. Vertical power line 126 which is near the $V_{DD}$ power pad has a greater width ($W_1$) than each width ($W_2$ to $W_4$) of the power lines 128 further away from the power pad such that $W_1 > W_2 > W_3 > W_4$. The width of the power lines further away from the power pad are, for example, decreased to match the pattern of decreasing current further away from the power pad as illustrated in FIGS. 3 and 5. Alternatively, the width of a group of power lines near a high current region is fixed at a larger width, and a group of power lines further away from a high current region are fixed at a smaller width. The width of each power line in the interconnect structure is designed to more uniformly distribute current densities below an upper current density through the integrated circuit. Such upper current density is the current density value at which the effects of electromigration begin for the particular application. In addition, each width is also designed to provide more efficient use of precious die area.

Figure 12:
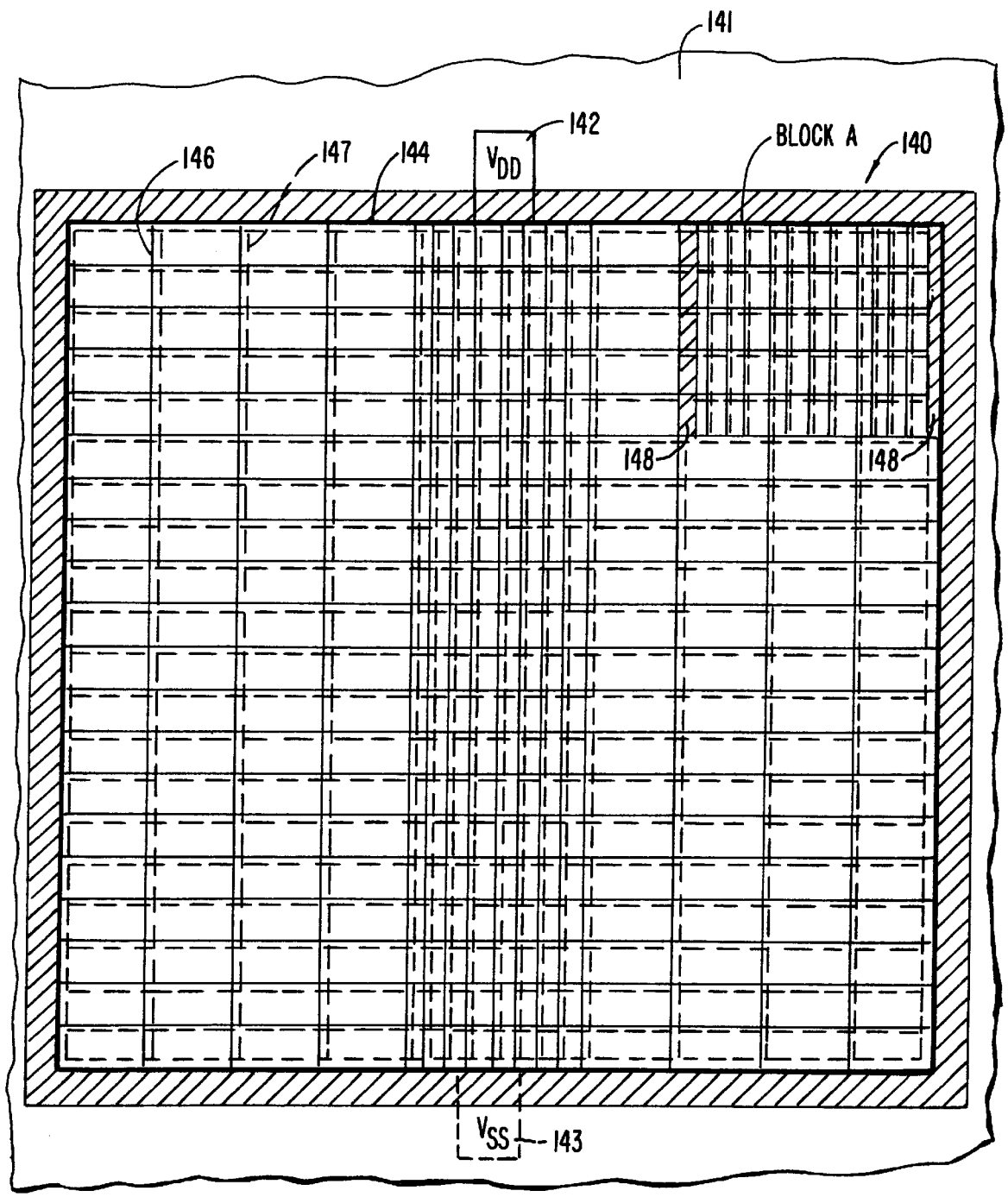
FIG. 12 is a top view of an additional embodiment of the improved power line structure with a power bus.

A modification to any of the preceding embodiments includes a fixed power bus configuration 140 of FIG. 12 on substrate 141. Similar to any of the previous embodiments, this embodiment includes a $V_{DD}$ power pad 142, $V_{SS}$ ground pad 143, power ring 144, $V_{DD}$ power lines 146, and $V_{SS}$ lines 147. The respective number of horizontal and vertical power lines are shown for illustrative purposes only and should not be limiting in any manner. Also, peripheral circuits, bonding pads, special cells, and interconnects which are typically components of any gate array structure are also not shown on substrate 141 to more clearly illustrate fixed power bus 148. The embodiment includes a structure represented as BLOCK A which is any structure requiring more current than its adjacent cells. To provide current through the integrated circuit to BLOCK A, the embodiment includes wider power bus 148. Such power bus is designed to provide a more uniform distribution of current densities through the integrated circuit below an upper current density. Such upper current density is the current density value at which the effects of electromigration begin for the particular application. The width of the power bus is also designed to provide more efficient use of die area. The fixed power bus configuration of FIG. 12 is in context to the embodiment of FIG. 9. Alternatively, the fixed power bus configuration may be combined with any of the preceding embodiments including but not limited to the embodiments of FIGS. 6 and 11. The fixed power bus configuration includes an interconnect structure with additional and/or wider power lines near regions of high current density. Such regions may include a corner region as the embodiment of FIG. 12 or alternatively an edge region, a center region, among others.

Figure 13:
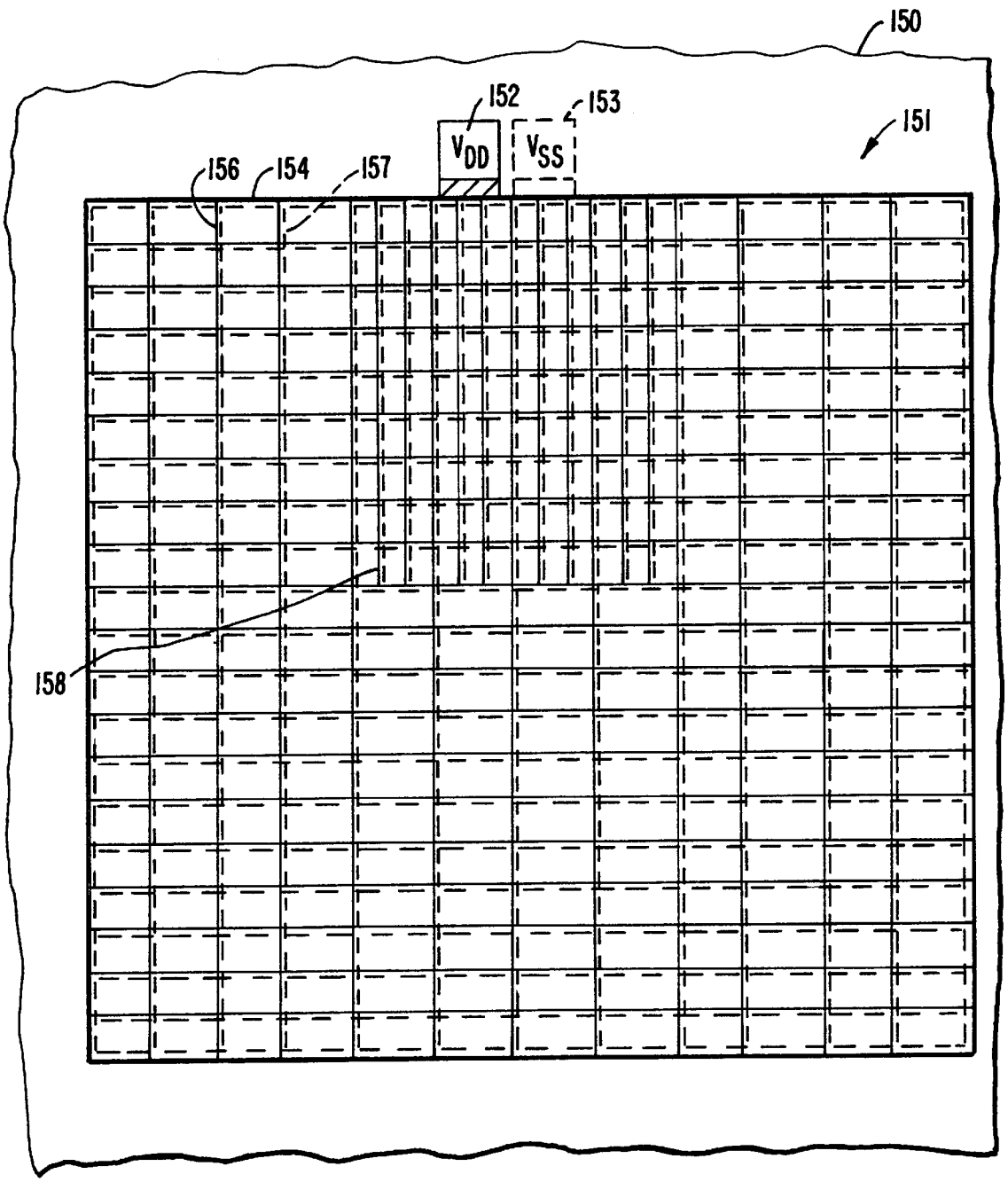
FIG. 13 is a top view of an alternative embodiment of the improved power grid structure having vertical power lines which do not extend to an opposite end of the die.

A further variation to any of the preceding embodiments includes an interconnect structure with additional and/or wider power lines which extend to a center region (any region not at an opposite end) of the integrated circuit. FIG. 13 shows such structure 151 on substrate 150 in context to the structure of FIG. 9 for illustrative purposes only. Alternatively, the structure may also be in context to any of the preceding embodiments including but not limited to the improved power grid or power line structure with or without the fixed power bus configuration. Similar to any of the previous embodiments, this embodiment includes a $V_{DD}$ power pad 152, $V_{SS}$ ground pad 153, power ring 154, $V_{DD}$ power lines 156, and $V_{SS}$ lines 157. The respective number of horizontal and vertical power lines are shown for illustrative purposes only and should not be limiting in any manner. As shown, $V_{DD}$ power pad 152 and $V_{SS}$ ground pad 153, or generally the power pads are side-by-side at a center region near an edge of the die. Alternatively, the power pads may be located in a variety of regions depending upon the particular application. Also, peripheral circuits, bonding pads, special cells, and interconnects which are typically components of any gate array structure are also not shown on substrate 150 to more clearly illustrate the shorter additional vertical power lines 158. Additional vertical power lines begin adjacent to a higher current region (typically near a power pad) and terminate at a lower current region, typically further away from the power pad. Such lower current region may be near a center region of the integrated circuit but is not generally at an edge region opposite the power pads like the preceding embodiments. By concentrating the additional vertical power lines only near regions directly adjacent to the power pad, the remaining portions of the die are preserved for fabricating active areas and/or cells. Furthermore, the additional vertical power lines are designed to more uniformly distribute current densities through the device, and provide current densities which are below an upper current density. Such upper current density is a current density value were the effects of electromigration begin for the particular application.

In the preceding embodiments, there are typically at least two levels of interconnects in the gate array structure. At least two levels of interconnects are needed to permit signal and power lines from crossing without contacting. The two interconnect levels can both be metallic or one level can be metallic and the other semiconductor such as doped polysilicon, doped single-crystal silicon, among others, or any combination thereof. Such combination may also include silicides or the like. Generally, each interconnect level must comprise materials having conductive characteristics. The interconnects are routed on both or either vertical and/or horizontal interconnects. For the preceding embodiments, a portion of a metallization layer includes at least horizontal lines and/or vertical lines. Automatic routing programs typically provide the placement of the connections. The different embodiments shown can be applied to a single interconnect level or any combination of multiple interconnect levels.

The improved power line structures are fabricated from materials including aluminum, polysilicon, single-crystal silicon, and the like. In the gate array structure, for example, the power line preferably comprises aluminum. Aluminum is alloyed typically with silicon and/or copper. Aluminum is typically sputtered onto the surface of the substrate. Thereafter, the aluminum layer is preferentially masked and etched to form the improved structures according to FIGS. 6, 9, 11, 12, and 13. An insulating layer or layers comprising at least silicon dioxide or silicon nitride is then deposited on top of the aluminum layer. Such insulating layer or layers is then masked and preferentially etched to expose at least the power pads.

Routing Technique

Routing interconnects through an integrated circuit according to this invention requires designing the layout configuration of the interconnects in such a way to provide more uniform current densities through the integrated circuit which are below an upper current density where the effects of electromigration begin for the particular application. The routing technique also provides a layout configuration for effectively using die surface area. The following techniques described herein provide desired electrical characteristics and improved utilization of die surface area.

The improved routing technique is described in reference to vertical lines of a typical gate array for illustrative purposes only. Such routing technique may also be applied to horizontal lines or any combination of vertical and horizontal lines for a single layer or multiple layers of interconnects. The technique also applies to a single power pad or multiple power pads located in a variety of regions. Such regions may include a corner or any edge region of the die. The concept of such power grid structure may also be applied to integrated devices including other types of ASICs, custom integrated circuits, standard products including at least MICROs, gate arrays, programmable devices, and the like. These integrated devices may employ technology such as MOSFET, CMOSFET, BiCMOS, bipolar, among others.

A specific embodiment for the improved routing technique comprises determining an initial value for the number of cells between adjacent common vertical lines (Ucs) or generally between adjacent common lines. Ucs may depend on a variety of factors including cell type, interconnect material and dimensions, and power requirements, among others. For illustrative purposes only, the present embodiment employs a gate array with an initial Ucs value of 20 cells for the vertical lines. The vertical lines comprise aluminum having a width between about $1.5\mu$ and about $3.0\mu$ and preferably about $2.1\mu$. Such lines also have a thickness between about $0.3\mu$ and about $1.0\mu$ and preferably about $0.7\mu$. Such Ucs value is designed to provide current densities less than about 1 mA/$\mu^2$ for the vertical lines near regions with less current flow, typically further away from the power pad. However, the regions which have higher current flow require additional vertical power lines routed therein creating a smaller Ucs value in such regions.

Figure 14:
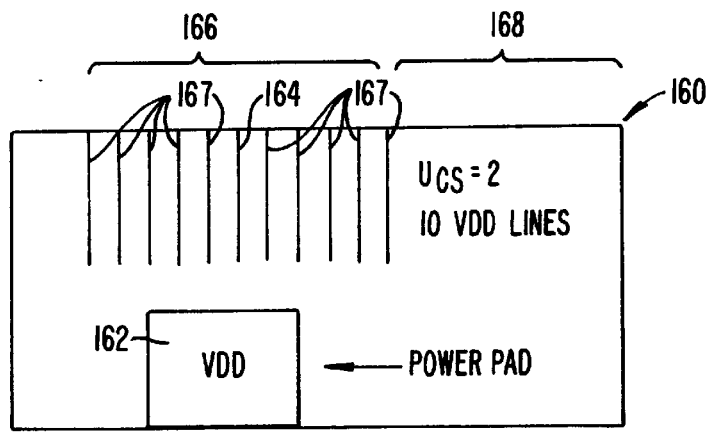
FIG. 14 is a top view of a portion of an embodiment of the resulting improved power grid structure according to the improved routing technique.

In the device 160 of FIG. 14, for example, the region near the power pad (region with higher current flow) is routed with additional lines such that the Ucs value is between about one cell and about six cells, and preferably at about two cells. The device includes both a $V_{SS}$ (not shown) and $V_{DD}$ power pad 162, or generally the power pads, which are respectively connected to the substrate and power. When vertical power lines in common with $V_{SS}$ do not alternate with the power lines in common with $V_{DD}$, extra vertical power lines are routed around a vertical power line adjacent to the $V_{DD}$ power pad. In the present example, ten extra vertical power lines are routed proximate to the $V_{DD}$ power pad 162. In particular, five additional vertical power lines 167 are added to each side of vertical power line 164 directly above the $V_{DD}$ power pad 162. After routing the additional lines, each adjacent pair of vertical power lines in region 166 has two cells in between or a Ucs of two cells. Such vertical power lines have a current density less than 1 mA/$\mu^2$. As illustrated, the line density is up to ten times greater in region 166 than outside region 168 of the integrated circuit which has a Ucs value of 20 cells.

Figure 15:
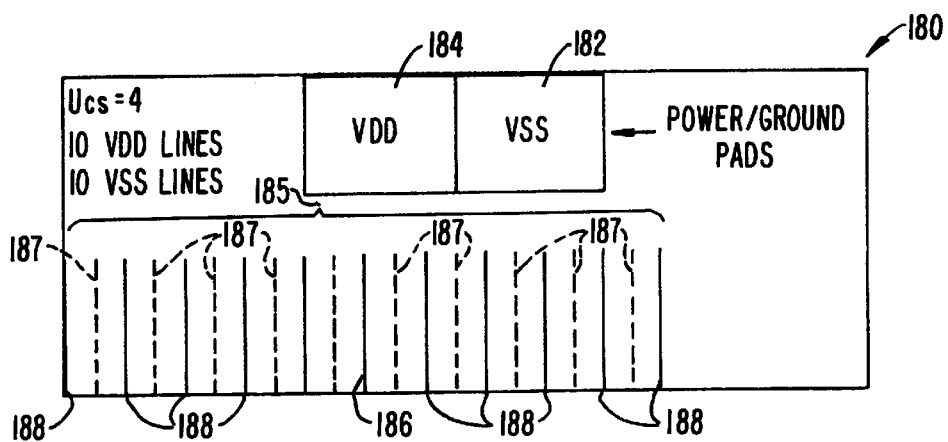
FIG. 15 is a top view of a portion of an alternative embodiment of the resulting improved power grid structure according to the improved routing technique.

In an alternative embodiment 180 of FIG. 15, both $V_{SS}$ 182 and $V_{DD}$ 184 power pads are adjacent to each other. Similar to the preceding embodiment, the vertical lines have an original Ucs of 20 cells. Additional power lines are routed in high current region 185 around vertical power line 186 directly beneath power pads 182, 184. Five $V_{SS}$ power lines 187 (broken lines) alternative with five $V_{DD}$ power lines 188 (solid lines) on each side of vertical $V_{DD}$ power line 186. Although Ucs is four cells for additional $V_{SS}$ or $V_{DD}$ power lines, a power line is routed after every two cells beginning from either side of vertical power line 186 in high current region 185. Accordingly, the amount of metallization directly beneath power pads 182, 184 in this embodiment is the same as the embodiment of FIG. 14.

Figure 16:
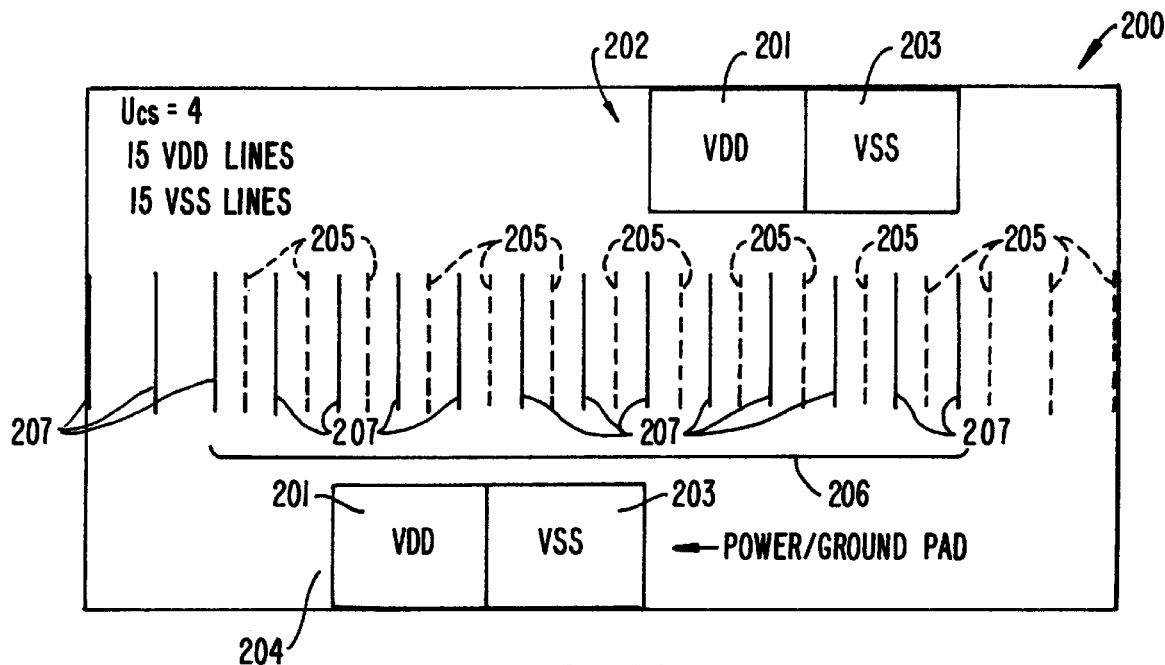
FIG. 16 is a top view of a portion of a further alternative embodiment of the resulting improved power grid structure according to the improved routing technique.

Another specific embodiment 200 is illustrated in FIG. 16. As shown, both $V_{DD}$ 201 or $V_{SS}$ 203 power pads are at an upper region 202 and a lower region 204 substantially beneath the upper region. Similar to the preceding embodiment, the vertical power lines have an original Ucs of 20 cells. This embodiment routes fifteen additional $V_{SS}$ power lines 205 (broken lines) and fifteen additional $V_{DD}$ power lines (solid lines) where a portion of the additional $V_{DD}$ lines alternate with a portion of the additional $V_{SS}$ lines in region 206. Each group of power lines has a Ucs of four cells in region 206. In this routing technique, the power lines are shared between the power pads at regions 202 and 204. Alternatively, the power lines may not be shared between the power pads if regions 202 and 204 are not substantially in line with each other.

Figure 17:
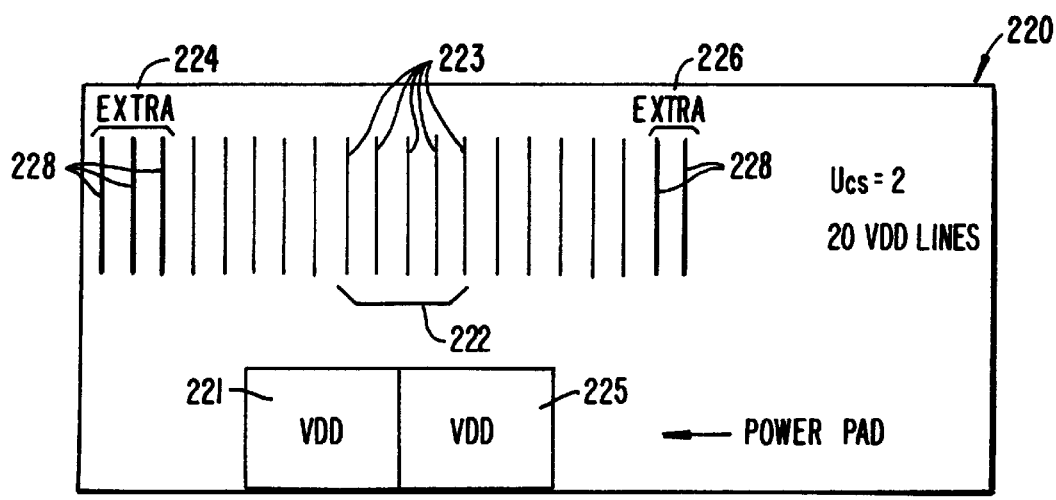
FIG. 17 is a top view of a portion of a modification to any previous embodiment of the resulting improved power grid structure according to the improved routing technique.

A modification 220 to any of the preceding embodiments is illustrated in FIG. 17. In some cases, it is difficult to route a portion of additional power lines in region 222 which is directly adjacent to either $V_{DD}$ or $V_{SS}$ power pads. Such cases include the corner of an I/O array or when two power pads (or $V_{SS}$ pads) are directly adjacent to each other, among others. A portion of additional power lines are routed in region 222 and a remaining portion of additional power lines 228 are routed on each or either side 224, 226 of region 222. The embodiment may or may not have an equal number of lines on each side of region 222. Like the previous embodiments, $V_{DD}$ power pads 221, 225 are also shown.

A further embodiment includes routing the various power lines as a direct function of current distribution through the integrated circuit. In this embodiment, the current density distribution through the integrated circuit is estimated or predicted for a worst case situation possibly through a current simulator, custom software, or the like. Alternative, the actual device may be exercised to predict the worst case current distribution. The worst case current distribution generally includes the largest current gradients through the particular integrated circuit being estimated, exercised or simulated. Based on the distribution, lines are designed either with a varying pitch/Ucs or width or a combination thereof such that the current density distribution for the improved integrated circuit is more uniform and below an upper current density. Such upper current density is generally below the current density value where the detrimental effects of electromigration begin for the particular application. The functional relationship between pitch/Ucs or width for a particular group of lines (horizontal or vertical) with respect to distance from the power pad or high current structure may be linear, exponential, sinusoidal, $n^{th}$ order, or combination thereof, or the like. Of course, the exact relationship between the power lines and the distance from the power pad will depend on the estimated or actual or simulated current distribution for the particular integrated circuit.

While the above is a full description of the specific embodiments, various modifications, alternative constructions, and equivalents may be used. For example, while the description above is in terms of a gate array it would be possible to implement the present invention with other cell-based or standard cell or full-custom designs. Such designs may employ technology including MOSFET, CMOSFET, BiCMOS devices, bipolar transistors, among others. In addition, the integrated circuit shown in FIGS. 14, 15, 16, and 17 are in terms of a power line structure for a gate array with at least a single high current region. A skilled artisan may, alteratively, employ any combination of structures including a power grid with constant power line width and a power line structure with varying power line widths or the like. Such combination of structures may be employed with a single higher current region and/or multiple higher current regions and/or a plurality of power pads. Furthermore, quantizing Ucs into a one-step function including Ucs of 2 and 20 for the integrated circuit is shown only for illustrative purposes. It is possible to separate Ucs into n steps (n>1) for a particular integrated circuit structure. Such structure is generally designed with a smaller Ucs value near regions of high current density typically near a power pad, and a larger Ucs value near regions of lower current density typically further away from a power pad.

Therefore, the above description and illustrations should not be taken as limiting the scope of the present invention which is defined by the appended claims.

What is claimed is:

1. An interconnect structure comprising:
   a metallization layer having a portion forming at least one power pad connected to a plurality of power lines, said plurality of power lines comprising a portion overlying an inactive region and a portion overlying an active cell region, said active region comprising at least a plurality of cells, each of said cells having a substantially similar gate width and length, said inactive region portion defining a power bus structure, said active cell region portion defining a plurality of lines, each of said plurality of lines substantially parallel to each other geometrically and connected to said power bus structure substantially in parallel to each other electrically; and
   wherein said active cell region portion comprises a first portion of said lines formed geometrically closer to said power pad and a second portion of said lines geometrically further from said power pad, said first portion of said lines comprising a higher metallization density than said second portion of said lines, each of said lines in said first portion having a larger width than any one of said lines in said second portion and each of said lines in said active cell region portion having substantially a constant width and thickness along said active cell region for an efficient allocation of a surface area of said active cell region.

2. The interconnect structure of claim 1 wherein said first portion of said lines have a smaller pitch adjacent to each other than a pitch of said second portion of said lines.

3. The interconnect structure of claim 2 wherein said smaller pitch increases to a larger pitch at said second portion of said lines.

4. The interconnect structure of claim 2 wherein said smaller pitch is a constant pitch for a desired number of said lines.

5. The interconnect structure of claim 1 wherein said larger width decreases to a smaller width in said second portion of said lines.

6. The interconnect structure of claim 1 wherein said active cell region comprises CMOS cells.

7. The interconnect structure of claim 1 wherein said first portion of said lines and said second portion of said lines each include a current density of less than about 1 mA/$\Phi^2$ to prevent a possibility of electromigration.

8. The interconnect structure of claim 1 wherein said first portion of said lines includes a line density of about ten times greater than said second portion of said lines.

9. An application specific integrated circuit device comprising an interconnect structure, said interconnect structure comprising:
   a semiconductor substrate comprising an inactive region and an active region, said active region comprising at least a plurality of cells, each of said cells having a substantially similar gate width and length defined in an inner portion of said substrate, said inactive region being defined in a peripheral portion of said substrate;
   a power pad defined overlying said inactive region;
   a power bus structure defined along said peripheral portion and overlying said inactive region, said power bus structure being connected to said power pad; and
   a plurality of lines defined overlying said active region, each of said lines having a substantially constant width and thickness along said active region, each of said lines substantially parallel to each other geometrically and connected to said power bus structure substantially in parallel to each other electrically;
   wherein said plurality of lines comprise a first line set and a second line set, said first set line being formed geometrically closer to said power pad than said second line set, said first line set having a higher amount of metallization per active region than said second line set for the efficient allocation of a surface area of said active region, each of said line sets comprising lines, each of said lines in said first line set having a larger width than any one of said lines in said second line set and each of said lines having a substantially constant width and a substantially constant thickness.

10. The device of claim 9 wherein said higher amount of metallization is provided by said first line set having a smaller pitch adjacent to each other than a pitch of said second line set.

11. The device of claim 10 wherein said smaller pitch increases to a larger pitch.

12. The device of claim 10 wherein said smaller pitch is a constant pitch for a desired number of said lines.

13. The device of claim 9 wherein said larger width decreases to a smaller width.

14. The device of claim 9 wherein said active cell region comprises CMOS cells.

15. The device of claim 9 wherein said lines in said first line set and said lines in said second line set each have a current density of less than about 1 mA/$\Phi^2$.

16. The device of claim 9 wherein said first line set includes a line density of about ten times greater than said second line set.

17. An application specific integrated circuit device comprising an interconnect structure, said interconnect structure comprising:
   a semiconductor substrate comprising an inactive region and an active region, said active region comprising at least a plurality of cells, each of said cells having a substantially similar gate width and length defined in an inner portion of said substrate, said inactive region being defined in a peripheral portion of said substrate;
   a metallization layer, said metallization layer comprising:
      a power pad defined overlying said inactive region;

a power bus structure defined along said peripheral portion and overlying said inactive region, said power bus structure being connected to said power pad; and a plurality of lines defined overlying said active region, each of said lines having a substantially constant width and thickness along said active region, each of said lines substantially parallel to each other geometrically and connected to said power bus structure substantially in parallel to each other electrically;

said plurality of lines comprise a first set of lines and a second set of lines, said first set of lines being formed geometrically closer to said power pad than said second set of lines, said first set of lines having a higher amount of metallization per active region than said second set of lines, each of said lines in said first set of lines and said second set of lines having said substantially constant width and thickness for an efficient allocation of surface area in said active region, said first set of lines and said second set of lines having a current density of less than about 1 mA/$\Phi^2$ to prevent a possibility of electromigration; and a metallization structure underlying said metallization layer to provide at least two metallization layers, said metallization structure having a plurality of power lines defined overlying said active region, each of said power lines having a substantially constant width and thickness along said active region, each of said power lines substantially parallel to each other geometrically and connected to said power bus structure substantially in parallel to each other electrically, said plurality of power lines having a first power line set and a second power line set, said first power line set being formed geometrically closer to said power pad than said second power line set, said first power line set having a higher amount of metallization per active region than said second power line set.

* * * * *